(12) United States Patent
Strom et al.

(10) Patent No.: US 11,527,953 B1
(45) Date of Patent: Dec. 13, 2022

(54) HIGHER YIELDING IMPROVED MATCHING REFERENCE CIRCUIT ESPECIALLY APPLICABLE FOR HIGH SPEED MIXED SIGNAL APPLICATIONS AND PHASE LOCKED LOOPS AND CHARGE PUMPS

(71) Applicant: International Business Machines Corporation, Armonk, NY (US)

(72) Inventors: James Strom, Rochester, MN (US); John Borkenhagen, Rochester, MN (US); Ann Chen Wu, Hopewell Junction, NY (US); Erik Unterborn, Cary, NC (US); Grant P. Kesselring, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/506,829

(22) Filed: Oct. 21, 2021

(51) Int. Cl.
*H02M 3/07* (2006.01)
*H03H 11/28* (2006.01)
*H03L 7/093* (2006.01)

(52) U.S. Cl.
CPC .............. *H02M 3/07* (2013.01); *H03H 11/28* (2013.01); *H03L 7/093* (2013.01)

(58) Field of Classification Search
CPC ...................................................... H02M 3/07
See application file for complete search history.

(56) References Cited

U.S. PATENT DOCUMENTS

| | | | |
|---|---|---|---|
| 6,005,425 A | 12/1999 | Cho | |
| 9,768,684 B1 * | 9/2017 | Banerjee | ............... H03L 7/0891 |
| 9,979,405 B1 | 5/2018 | Deng | |
| 10,008,980 B2 | 6/2018 | Bashir | |
| 10,826,389 B1 * | 11/2020 | Seo | ......... H04N 5/361 |
| 2011/0188283 A1 * | 8/2011 | Chevallier | ............... G11C 5/02 |
| | | | 977/755 |
| 2017/0207642 A1 * | 7/2017 | Sato | ...................... H02J 7/0031 |

OTHER PUBLICATIONS

J. Dunning, G. Garcia, J. Lundberg and E. Nuckolls, "An all-digital phase-locked loop with 50-cycle lock time suitable for high-performance microprocessors," in IEEE Journal of Solid-State Circuits, vol. 30, No. 4, pp. 412-422, Apr. 1995, doi: 10.1109/4. 375961.

(Continued)

*Primary Examiner* — Sibin Chen
(74) *Attorney, Agent, or Firm* — Robert R. Williams

(57) ABSTRACT

A phase locked loop having a charge pump is described. The charge pump relies on close matching of FETs (Field Effect Transistor) electrical parameters to FETs in a current reference circuit. To achieve close matching of FET electrical performance, FEOL (Front End Of Line), comprising all FET shapes, of the current pump is identical in shapes and layout to the current reference circuit. BEOL (Back End Of Line) differs between the charge pump and the current reference circuit. The charge pump and the current reference circuit are arranged in a row. A shield circuit having FEOL shapes and layout identical to the current pump may be placed at each end of the row.

6 Claims, 8 Drawing Sheets

(56) References Cited

OTHER PUBLICATIONS

V. Kratyuk, P. K. Hanumolu, U. Moon and K. Mayaram, "A Design Procedure for All-Digital Phase-Locked Loops Based on a Charge-Pump Phase-Locked-Loop Analogy," in IEEE Transactions on Circuits and Systems II Express Briefs, vol. 54, No. 3, pp. 247-251, Mar. 2007, doi: 10.1109/70811.2006.889443.

R. B. Staszewski and P. T. Balsara, "All-Digital PLL With Ultra Fast Settling," in IEEE Transactions on Circuits and Systems II: Express Briefs, vol. 54, No. 2, pp. 181-185, Feb. 2007, doi: 10.1109/TCSIL2006.886896.

G. Yu, Y. Wang, H. Yang and H. Wang, "A fast-locking all-digital phase-locked loop with a novel counter-based mode switching controller," TENCON 2009—2009 IEEE Region 10 Conference, 2009, pp. 1-5, doi: 10.1109/TENCON.2009.5396168.

\* cited by examiner

Front End of Line (FEOL)
FET P1

FEOL FET P1 and Back End of Line (BEOL) coupling having nine
P1 FEOL FETS coupled in parallel. BEOL in BOLD

FEOL P1 and BEOL coupling having nine P1 FEOL FETS
coupled as three independent FETs. BEOL in BOLD

HIGHER YIELDING IMPROVED MATCHING REFERENCE CIRCUIT ESPECIALLY APPLICABLE FOR HIGH SPEED MIXED SIGNAL APPLICATIONS AND PHASE LOCKED LOOPS AND CHARGE PUMPS

BACKGROUND

Recent semiconductor processes, especially before a new generation of the process has matured, such as a 7 nm (nanometer) process may have device tracking parameters that are outside the specified distributions for those device parameters and therefore not modeled correctly.

Some circuits, such as a PLL (phase locked loop). often used in clock circuits on semiconductor chips, are sensitive to mistracking of PFET to PFET, NFET to NFET, and PFET to NFET due to threshold, or other, anomalies in the FETs.

SUMMARY

Embodiments of the invention provide methods and apparatus to provide yield enhancement on semiconductor chips in 7 nm (nanometer) and smaller technology.

Early chips using 7 nm technology have had failures due to device mistracking. Tracking between a first FET (Field Effect Transistor) and a second FET is very strongly dependent on how far the first FET and the second FET are physically distanced on a semiconductor chip as well as the shapes and layout of circuitry surrounding the FETs that are desired to match closely. Tracking means that the first and second FET have similar device electrical characteristics, such as threshold voltage. Modern FETs are completely fabricated during FEOL (Front End Of Line) processing in a semiconductor fabrication facility. Tracking between the first FET and the second FET are also dependent on differences in nearby shapes fabricated during FEOL processing Embodiments of the invention improve tracking between the first FET in a first circuit and the second FET in a second circuit. The first circuit laid out for a particular function. That particular function may be a charge pump slice. The first circuit has a particular FEOL set of shapes and arrangement, and a particular BEOL (Back End Of Line) interconnect pattern. The second circuit having identical FEOL shapes and arrangement, the second circuit may be a current reference circuit that provides a current mirror voltage used by the first circuit for current mirror purposes.

DETAILED DESCRIPTION

Until recently in the semiconductor fabrication technology, FETs (Field Effect Transistors), PFETs being P-Channel Field Effect Transistors and NFETs being N-Channel Field Effect Transistors, could be reliably counted on to track electrical characteristics such as currents versus gate to source and gate to drain voltages. Tracking means that a first PFET would reliably perform very similarly to a second PFET, especially when within a specified distance from each other on a semiconductor chip. Similarly, a first NFET would reliably perform very similarly to a second NFET within a specified distance from each other on the semiconductor chip. Historically, there was also a reliably specified degree of tracking between NFETs and PFETs, again within a specified distance from each other on the semiconductor chip. This tracking was caused by semiconductor processing causing a channel length of a first transistor to be similar to a second transistor. FET thresholds are well known to be related to channel lengths and doping of the channels. Nearby shapes also affect FET tracking.

With the advent of 7 nm (nanometer) semiconductor technology, FET tracking has become even more sensitive to distance between FETs and surrounding structures in the FEOL (Front End Of Line) processing. Modern FETs are created entirely in FEOL processing.

PLLs (Phase Locked Loops) are particularly affected by mistracking between FETs in charge pumps and FETs in current references that provide a current mirroring voltage to control the FETs in the charge pump.

Embodiments of the invention provide physical layouts and arrangements of charge pumps and current references to reduce FET mistracking to reduce mismatch between increment and decrement currents driven by the charge pump, as will be described later.

Figure 1A:
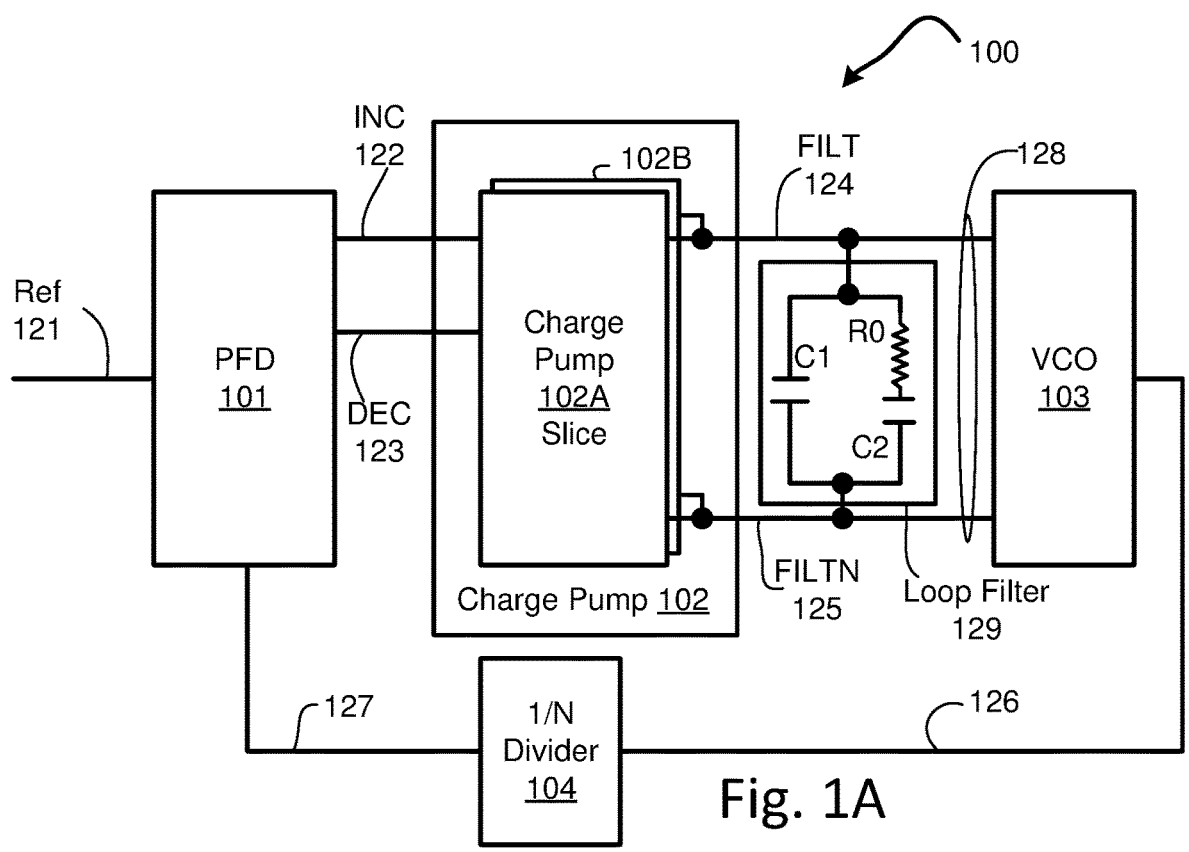
FIG. 1A is a block diagram of a PLL (phase locked loop).

With reference now to FIG. 1A, an exemplary PLL 100 is shown. A PFD (Phase Frequency Detector)101 receives a reference Ref 121 having a reference frequency. The PFD outputs INC 122 and DEC 123 to charge pump 102. Charge pump 102 may comprise a number of charge pump 102 slices, two such charge pump 102 slices referenced as charge pump slices 102A and 102B. Charge pump 102 may comprise a single charge pump 102 slice or many, for example, eight charge pump 102 slices. Even more than eight charge pump 102 slices are contemplated.

Charge pump 102 outputs current pulses on FILT 124 and FILTN 125 which together form a differential signal 128 with FILT 124 being a plus phase and FILTN 125 being a negative phase. Loop filter 129 filters current pulses from charge pump 102 on the differential signal 128 using C1 for very high frequency noise and the RO resistor and C2 capacitor for lower frequency components. In general, C1 capacitance is on the order of 10% of a capacitance of C2. Loop filters are well understood in the art and will not be further described herein.

The differential signal 128 is received by VCO (Voltage Controlled Oscillator) 103. VCO 103 increases frequency of signal 126 as the differential signal 128 voltage increases and decreases frequency of signal 126 as the differential signal 128 voltage decreases. Signal 126 may also be a differential signal.

A 1/N divider 104 receives signal 126 and divides frequency on signal 126 by N, and outputs a 1/N divided frequency on signal 127. Signal 127 is received by PFD 101 which compares phase and frequency of signal 127 to that of Ref 121 and outputs INC 122 or DEC 123 as needed to provide a desired frequency on signal 126, which may be used as a clock on a semiconductor chip.

Figure 1B:
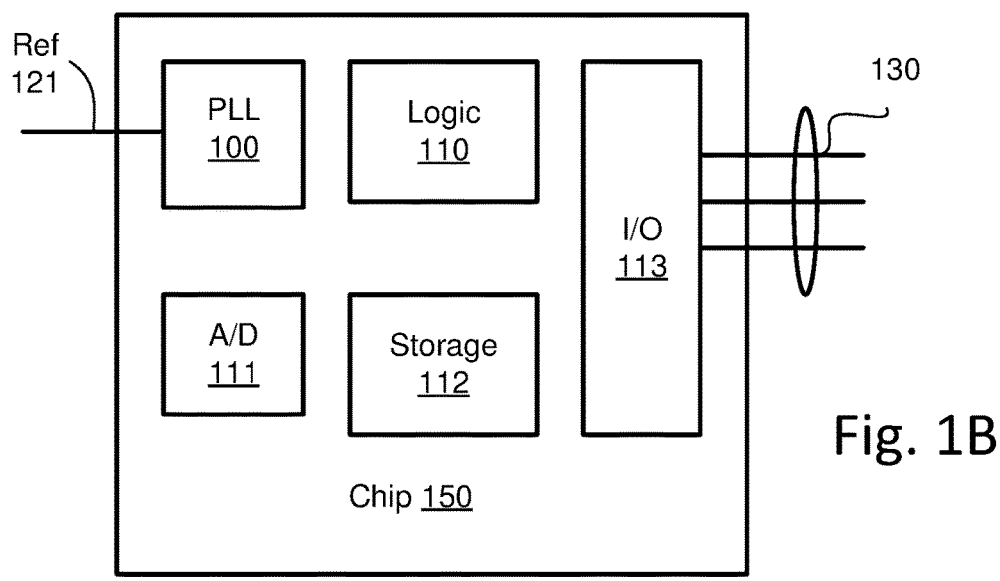
FIG. 1B is a block diagram of the PLL on a semiconductor chip.

FIG. 1B shows a chip 150 which comprises one or more PLL 100 instances which receive Ref 121, logic 110 to perform a desired function of chip 150, storage 112, and I/O circuitry 113. Each instance of a PLL 100 may receive a separate Ref 121. I/O circuitry 113 is coupled to signals 130 for communication to and from chip 150. Storage 112 may comprise DRAM (Dynamic Random Access Memory), SRAM (Static Random Access Memory), ROS (Read Only Storage), electronic fuse storage, latches, registers, or any other on-chip storage of information. Chip 150 may further include A/D (analog to digital) 111 circuitry.

Figure 4A:
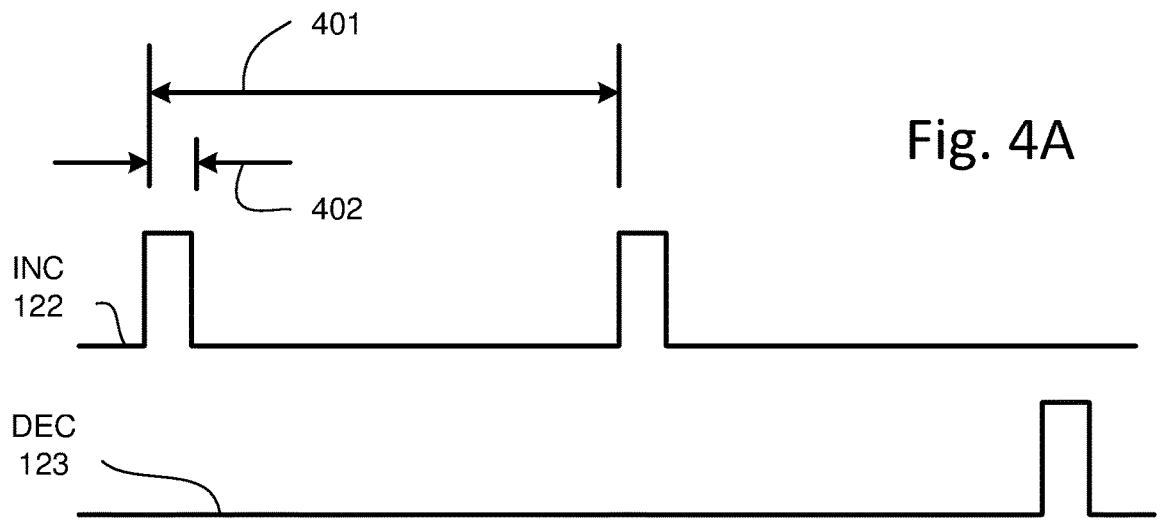
FIG. 4A shows INC (increment) pulses and DEC (decrement) pulses that are generated by a PFD (Phase Frequency Detector) and used by the charge pump slice to increase or to decrease a differential voltage used by a VCO (Voltage Controlled Oscillator) to increase or to decrease a frequency of a signal from the VCO.

With reference now to FIG. 4A, an exemplary timing chart of signals INC 122 and DEC 123 are shown. INC 122 and INC 123 pulses are short, on the order of 30 ps (picoseconds), with the pulse widths referenced as 402. PFD 101 may activate one of INC 122 and DEC 123 infrequently, such as a ten ns (nanosecond) interval, referenced as 401, as a non-limiting example.

Figure 4B:
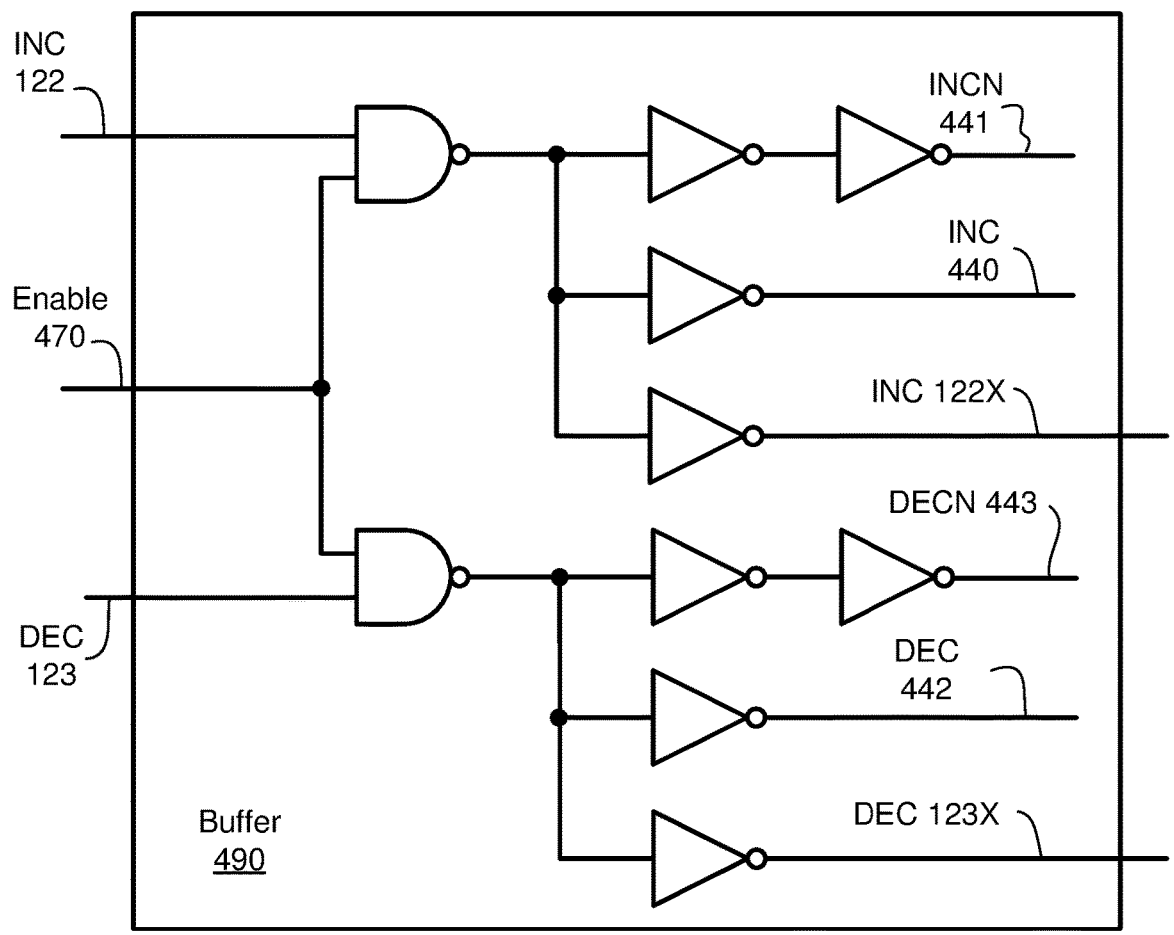
FIG. 4B shows a buffer circuit that creates local INC and DEC signals for a first charge pump slice from INC and DEC signals input to the first charge pump slice and to repower and forward the INC and DEC signals to a second charge pump slice. An enable input that may be unique to each buffer circuit provides enabling a selected number of charge pump slices.

Because of the very short pulse widths of INC 122 and DEC 123, buffer 490 is shown in FIG. 4B. The circuitry shows that INC 440 and INCN 441 are buffered plus and minus versions of INC 122 for use in a particular charge pump 102 slice. Similarly, DEC 442 and DECN 443 are buffered plus and minus versions of DEC 123 for use in the particular charge pump 102 slice.

In embodiments having multiple charge pump 102 slices, INC 122X and DEC 123X are output by buffer 490 and driven to the INC 122 and DEC 123 receiving inputs of a next charge pump 102 slice in a "daisy chain" fashion. This buffering is needed to maintain the pulse widths of INC 122 and DEC 123.

Buffer 490 may further comprise an enable 470 input. As shown in FIG. 4B, a "0" on enable 470 will prevent INC 122 and DEC 123 from switching currents from a receiving charge pump slice to loop filter 129 and will also halt "downstream" charge pump 102 slices in a "daisy chain" of charge pump 102 slices from switching currents. In an embodiment, each charge pump slice comprises a buffer 490 with an enable 470 input. Depending on which charge pump slice receives a "0" value, a magnitude of currents applied to loop filter 129 can be controlled. Controlling currents applied to loop filter 129 may support loop stability for different frequencies on Ref 121.

Figure 2:
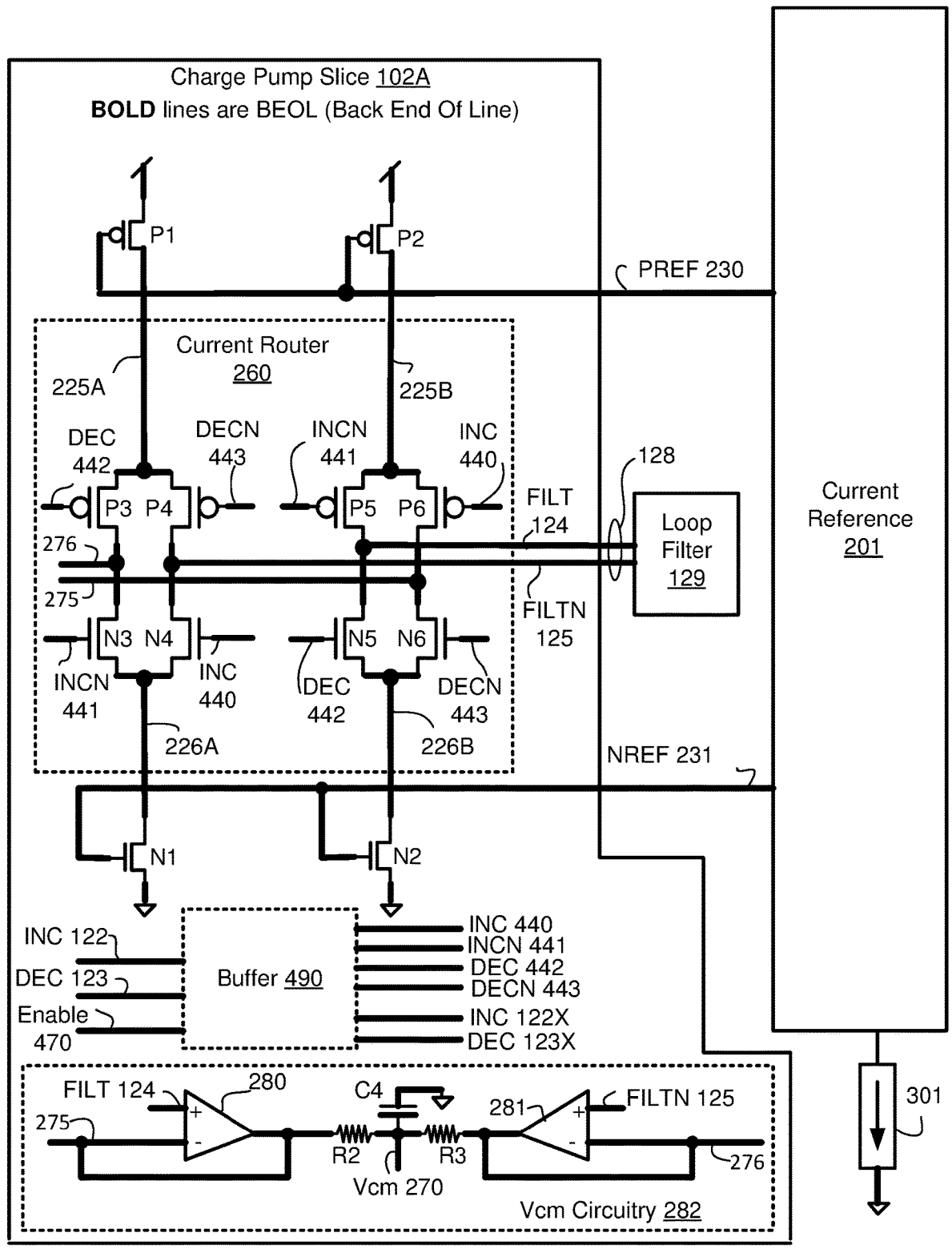
FIG. 2 shows a charge pump slice receiving voltage signals from a current reference used to control currents in mirroring PFETS (P-Channel Field Effect Transistors) and mirroring NFETS (N-Channel Field Effect Transistors). The controlled currents are applied to a loop filter based on increment and decrement signals received by the charge pump slice. NFETs and PFETs are created with FEOL (Front End Of Line) processing. Interconnection is created with BEOL (Back End Of Line) processing.

With reference now to FIG. 2, a charge pump 102A slice is shown. Charge pump slice receives PREF 230 and NREF 231 from a current reference 201. PREF 230 is a current mirror voltage that determines currents in P1 and P2. NREF 231 is a current mirror voltage that determines currents in N1 and N2. Current reference 201 receives a reference current 301 (exemplary and nonlimiting magnitude of reference current 301 may be 25 microamps) and runs reference current 301 through current mirror FETs (to be described with reference to FIG. 3) with the mirrored voltages being PREF 230 and NREF 231. It is important that the current mirror FETs in current reference 201 track well with mirroring FETs P1, P2, N1, and N2 in charge pump 102.

Charge pump 102A slice PFETs P1 and P2 respectively drive currents mirrored from voltage on PREF 230 on signals 225A and 225B to current router 260. N1 and N2 respectively drive currents mirrored from voltage on NREF 231 on signals 226A and 226B from current router 260.

Current router 260 comprises two "trees", a first "tree" having P3, P4, N3, and N4, and a second "tree" having P5, P6, N5, and N6. Signals 225A and 226A are coupled as shown in FIG. 2 to the first "tree" and signals 225B and 226B are coupled as shown to the second "tree".

Buffer 490, shown in detail in FIG. 4B is, for simplicity, simply shown as a block in FIG. 2.

When INC 441 is "1" and INCN is "0" the differential signal 128 voltage must increase. N4 and P5 are turned on, routing current on 225B to FILT 124 and routing current on signal 226A from FILTN 125, thereby increasing the differential signal 128 voltage.

When DEC 442 is "1" and DECN 443 is "0" the differential signal 128 voltage (do you want to label + and − on 128 on FIG. 2) must decrease. P4 and N5 are turned on, routing current from signal 225A to FILTN 125 and routing current from signal 226B FILT 124, thereby decreasing the differential signal 128 voltage.

As was seen in FIG. 4A and described above with exemplary times, INC 122 and DEC 123 are "0" almost all the time during normal operation. During this time, P3 and N3 are on and are coupled to signal 276. Likewise, during this time, P6 and N6 are on, and coupled to signal 275. A common mode voltage, Vcm 270, is a proxy for a common mode voltage on the differential signal 128. Vcm circuitry 282 including operational amplifiers 280 and 281, R2, R3, and C4 create a common mode voltage Vcm 270 that is the proxy for a common mode voltage of the differential signal 128. FILT 124 and FILTN 125 cannot directly be used to create Vcm 270 because current would flow between FILT 124 and FILTN 125, reducing amplitude of the differential signal 128. Operational amplifiers 280 and 281 are capable of supplying currents through R2 and R3. R2, R3, and C4 create and filter Vcm 270.

In embodiments comprising a plurality of charge pump 102 slices, the charge pump 102 slices may further comprise buffer 490, described above, to buffer and forward signals INC 122 and DEC 123. Each buffer may receive a separate enable 470 in order to control magnitude of currents applied to loop filter 129.

All FETs are created in the FEOL processing, and all interconnections are created in the BEOL processing. Interconnections (typically metal, such as aluminum or copper) are shown in BOLD lines in FIG. 2 and in FIG. 3.

Figure 3:
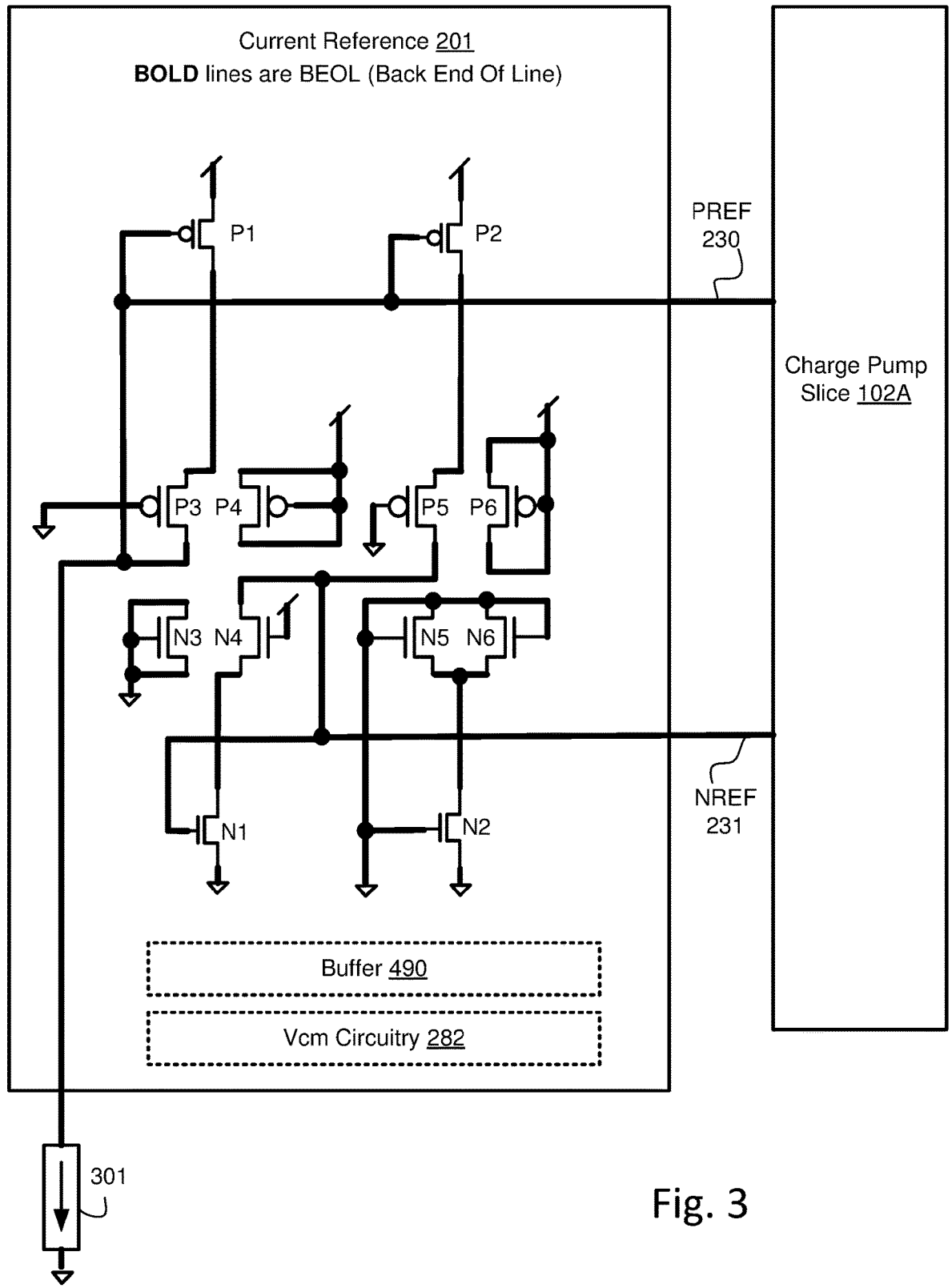
FIG. 3 is a high level schematic that shows the current reference having all FEOL shapes exactly like FEOL shapes in the charge pump slice.

With reference now to FIG. 2 and FIG. 3, it is shown that all FEOL shapes (P1, P2, P3, P4, P5, P6, N1, N2, N3, N4, N5 and N6) are identical for charge pump 102A and current reference 201, both in shapes and in location of shapes. To emphasize that the FEOL shapes in charge pump 102 slices are identical to the FEOL shapes in current reference 201, the FETs in charge pump 102A slice and current reference 201 are identical, the same reference numbers are used. That is, P1 in FIG. 2 and P1 in FIG. 3 are identical in shapes and locations. BEOL processing provides for proper function, but BEOL processing does not affect FET to FET tracking, which is determined by FEOL processing. It will be understood that the Vcm circuitry 282 described earlier having two operational amplifiers 280 and 281, R2, R3, and C4 may also have all FEOL shapes and locations included in charge pump 102 slices. For simplicity, the FETs in Vcm circuitry 282 is shown only as a schematic in FIG. 2 and as a box in FIG. 3. BEOL interconnect in Vcm circuitry 282 in current reference 201 will cause all FETs in the Vcm circuitry 282 in current reference 201 to be inactive. Similarly, in embodiments having a buffer 490 in a charge pump 102 slice, FEOL shapes in current reference 201 will be identical to those in the charge pump 102 slice.

In FIG. 3, current from reference current 301 is passed through P3 and P1 to create PREF 230. A band gap circuit or other reference current generated on chip 150 may be used for reference current 301. Alternatively reference current 301 may be brought onto chip 150 on a particular signal in signals 130. P3's gate is coupled to ground in current reference 201 because P3's gate in charge pump 102 is held at ground a high percentage of time by DEC 442 being at "0".

P2 mirrors PREF 230 through P5, N4, and N1 to provide NREF 231.

In current reference 201, P4 and P6 are turned off by having source, drain, and gate coupled to Vdd by BEOL interconnect. N3 has gate, drain, and source coupled to ground with BEOL interconnection. N5 and N6 have gates and drains coupled to ground with BEOL interconnection. N2 has gate and source coupled to ground with BEOL interconnection. Sources of N5 and N6 are coupled to a drain of N2 using BEOL interconnection. Alternatively, sources of N5 and N6, and the drain of N2 may be couple to Gnd.

Buffer 490 and Vcm Circuitry 282 are, for simplicity, shown as blocks in FIG. 3. All PFETs may have gate, drain, and source tied to Vdd with BEOL interconnect. All NFETs may have gate, drain and source tied to Gnd with BEOL interconnection in buffer 490 and Vcm circuitry 282 in FIG. 3. As noted above, all FEOL shapes are identical for a charge pump 102 slice and a current reference 201.

Figure 5:
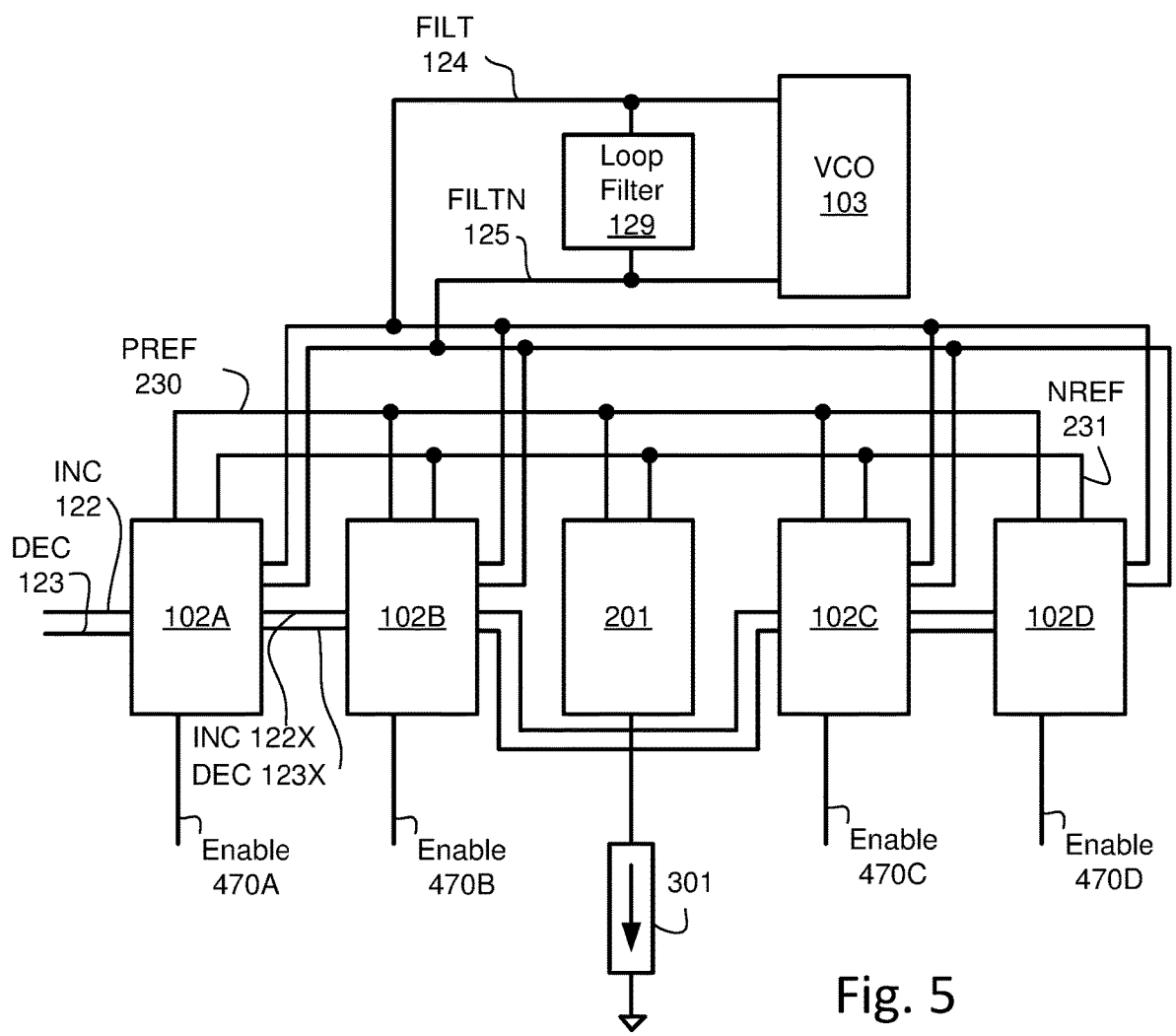
FIG. 5 shows a single current reference coupled to four charge pump slices. A "daisy chain" of the INC and DEC signals is also shown. A loop filter and a VCO are shown coupled to the charge pump slices.

FIG. 5 shows an exemplary arrangement of one current reference 201 and four charge pump 102 slices, referenced as 102A, 102B, 102C, and 102D. Current reference 201 receives current from reference current 301 and creates a mirror voltage reference on PREF 230 and on NREF 231 which are distributed to the four instances of charge pump 102 (102A, 102B, 102C, and 102D). Each charge pump 102 slice outputs a current equal to (or proportional to if a designer chooses to have different equivalent widths between the current mirror FET and the mirroring FET) reference current 301 to FILT 124 and FILTN 125 when INC 122 is active to increase differential signal 128 voltage, and, when DEC 123 is active, to decrease differential signal 128 voltage. Loop filter 129 filters the currents added (with proper phase to increase or decrease the differential signal 128 voltage and VCO 103 receives the filtered differential signal 128 voltage.

Currents supplied to FILT 124 and FILTN 125 may be changed to accommodate different frequency on Ref 121. This may be necessary to ensure PLL 100 loop stability or to make the PLL support different frequencies received on Ref 121.

Each charge pump 102 slice may receive an independent enable 470 to control how many of the four charge pump 102 slices shown will contribute current to FILT 124 and FILT 125 when INC 122 or DEC 123 are active. If all four enable 470 signals (470A, 470B, 470C, and 470D) are active ("1" for the embodiment shown in FIG. 4B), then FILT 124 and FILT 125 will receive current equal to reference current 301 from each current slice 102 (102A, 102B, 102C, and 102D) when INC 122 or DEC 123 is active. When enable 470A is active and enable 470B is inactive ("0"), then FILT 124 and FILT 125 receives a current equal to reference current 301 only from charge pump 102A slice when INC 122 or DEC 123 is active. Likewise, when enable 470A and enable 470B are active and enable 470C is inactive, then FILT 124 and FILT 125 will receive current only from charge pump 102 slices 102A and 102B when INC 122 or DEC 123 is active. When enable 470A, 470B, and 470C are active and enable 470D is inactive, FILT 124 and FILT 125 will receive current from charge pump 102 slices 102A, 102B, and 102C when INC 122 or DEC 123 is active.

The "daisy chain" of INC 122 and DEC 123 is shown in FIG. 5 and FIG. 7. INC 122X and DEC 123X from buffer 490 are received as INC 122 and DEC 123 by the following block in the "daisy chain". That is, INC 122X and DEC 123X are repowered versions of the INC 122 and DEC 123 from the previous charge pump 102 slice.

Since charge pump 102 slices are laid out (see FIGS. 5 and 7) next to each other, mistracking due to different FEOL layout is mitigated. As with FIG. 2, BEOL interconnections are shown in BOLD. A "shield" block 701 may be placed at each end of a row having charge pump 102 slices and current references 201. "Shield" block 701 has FEOL shapes and locations identical to those in charge pump 102 slices and current references 201. FIG. 7B, a "shield" block 701 (701A and 701B) is placed at each end of a row having charge pump 102 slices (102A, 102B, 102C, and 102D) and current references 201 (201A, 201B, and 201C).

Figure 6A:
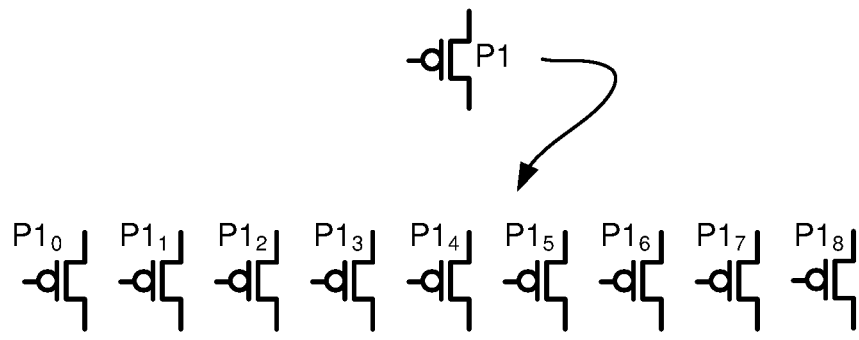
FIG. 6A shows an FET (PFET in the exemplary drawing) comprising a plurality of FETs after FEOL processing.
Figure 6B:
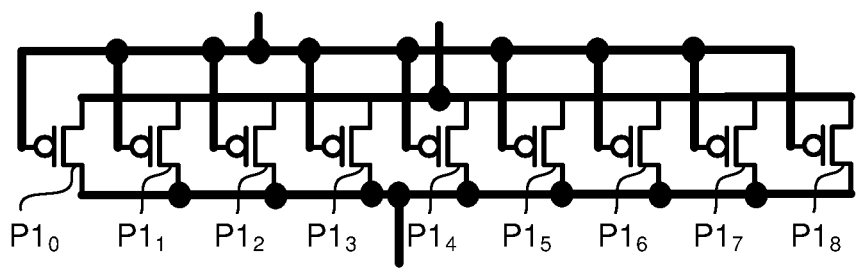
FIG. 6B shows the plurality of FETs of FIG. 6A coupled as a single FET by BEOL (Back End Of Line) interconnect processing.
Figure 6C:
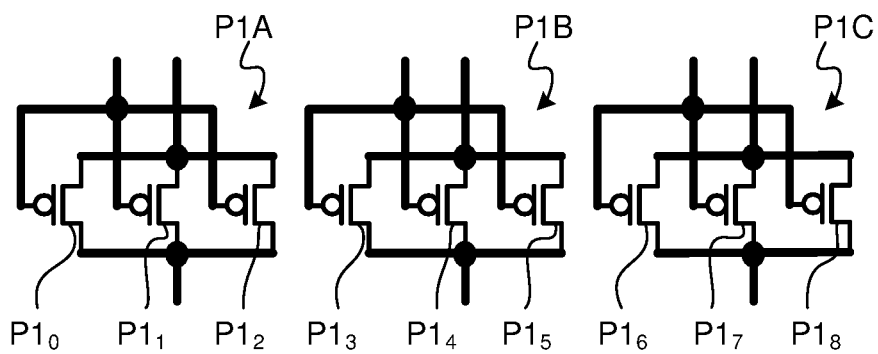
FIG. 6C shows the plurality of FETs of FIG. 6A coupled as three separate FETs by BEOL interconnect processing.

Having reference to FIGS. 6A, 6B, and 6C and with further reference to FIG. 7, a description of how multiple instances of current references 201 can be created and used to select currents applied to FILT 124 and FILT 125.

FETs are often laid out as a number of parallel "fins" (FinFets), each "fin" being a FEOL structure of a FET. It is understood that while "FinFets" are used for exemplary purposes, parallel interconnection of planar FETs or vertically stacked FETs are also contemplated. In FIG. 6A, FEOL of PFET P1 is shown as having nine "fins". More or fewer "fins" are contemplated. "Fins" in P1 as shown are denoted as P1$_0$, P1$_2$, P1$_2$, P1$_3$, P1$_4$, P1$_5$, P1$_6$, P1$_7$, and P1$_8$. P2, N1, and N2 also have nine "fins" in this exemplary arrangement.

FIG. 6B shows P1 having all nine "fins" connected in parallel as a single FET using BEOL interconnection.

FIG. 6C shows the nine "fins" of P1 connected by BEOL interconnection as three separate FETs, denoted as P1A, P1B, and P1C. P1A has P1$_0$, P1$_1$, and P1$_2$. Gates of P1$_0$, P1$_1$, and P1$_2$ are connected with BEOL interconnect. Drains of P1$_0$, P1$_1$, and P1$_2$ are connected with BEOL interconnect. Sources of P1$_0$, P1$_1$, and P1$_2$ are connected with BEOL interconnect. Gates, drains, and sources of P1B and P1C are similarly connected with BEOL interconnect.

Ability to interconnect the number of parallel "fins" in a current reference 201 in P1 (and it is understood that P2, N1, and N2 are likewise constructed) allows having multiple instances of current reference 201 as shown in FIG. 7. Multiple instances of current reference 201 may provide better "averaging" of mistracking. Three "fins" in each instance of current reference 201 (201A, 201B, and 201C in FIG. 7) of the nine "fins" shown in FIG. 3 having FEOL shapes for P1, P2, N1, and N2, while six "fins" in each instance of current reference 201 of P1, P2, N1, and N2 are not used. That is, gate, drain, and source of unused "fins" in instances of current reference 201 are coupled with BEOL interconnect to Vdd for PFETs and ground for NFETs. All nine "fins" in identical FEOL shapes of P1, P2, N1, and N2 of charge pump 102 slices are enabled by BEOL interconnect.

Figure 7A:
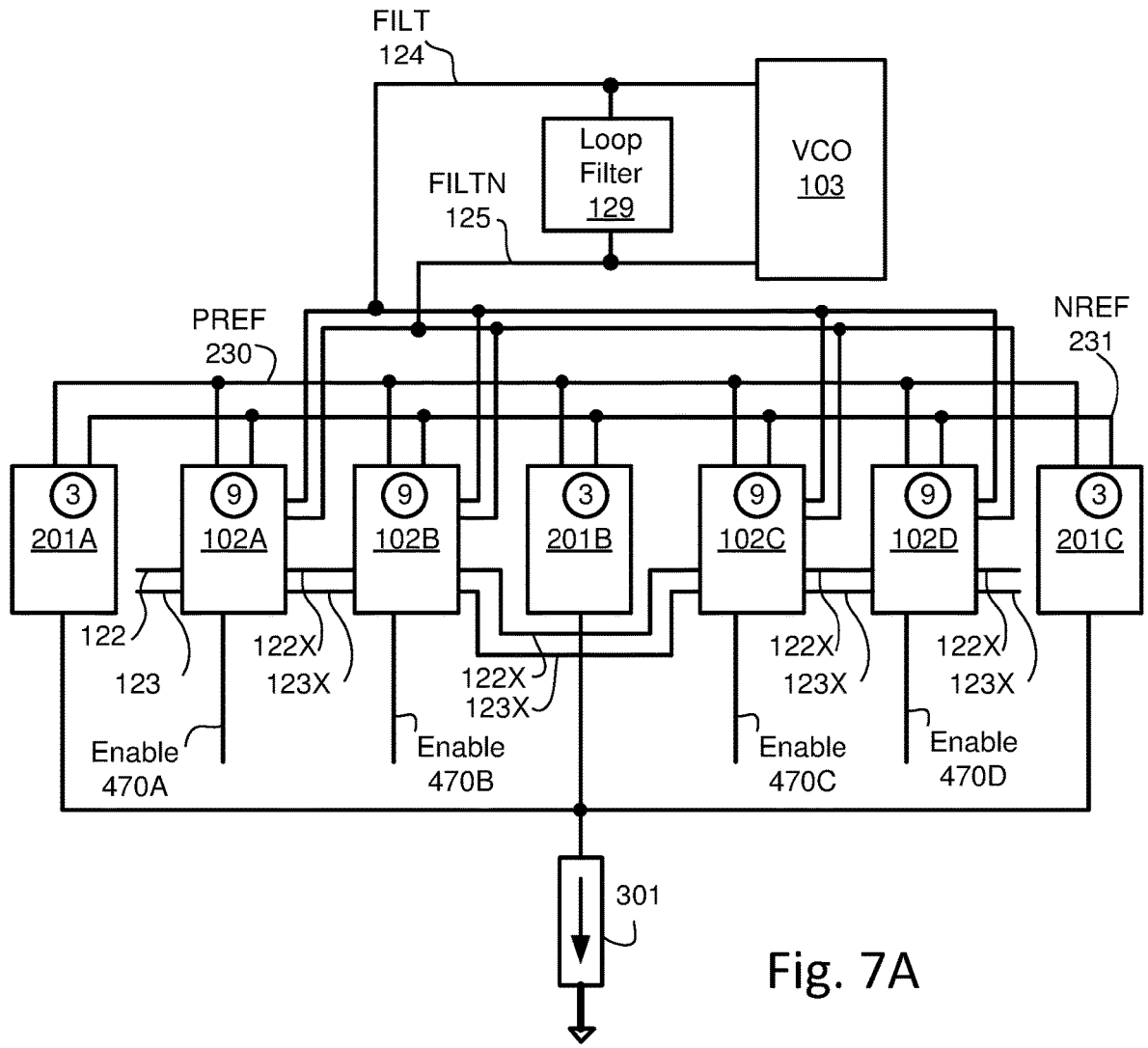
FIG. 7A shows four charge pump slices coupled to three current references.
Figure 7B:
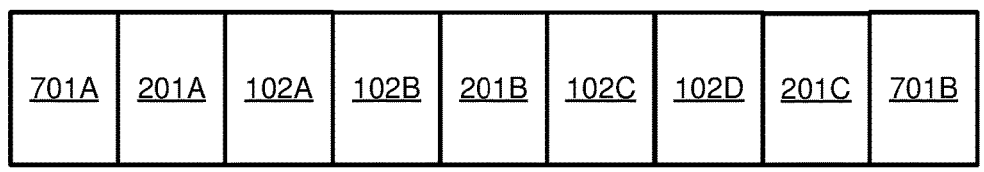
FIG. 7B shows the four charge pump slices and three current reference blocks of FIG. 7A but shows a physical layout having the charge pump slices and current references butted up against each other. Also, a shield block is included at each end of the layout; the FEOL shield block having the same FEOL shapes and layout of the shapes as the charge pump slices and the current references.

In FIG. 7A, a circled number indicates a number of active "fins". Charge pump 102 slices 102A, 102B, 102C, and 102D all have nine active "fins" connected by BEOL as nine "fin" FETs connected as shown in FIG. 6B. Current references 201A, 201B, and 201C all have three active "fins" connected as shown in FIG. 6C, where HA has gates of P1$_0$, P1$_1$ and P1$_2$ connected to reference current 301 by BEOL interconnect; sources connected to Vdd; and drains connected by BEOL to signal 225A in FIG. 2. P1B and P1C having "fins" P1$_3$, P1$_4$, P1$_5$, P1$_6$, P1$_7$ and P1$_8$, which have gates, drains, and sources connected by BEOL interconnect to Vdd. Similarly, P2, N1, and N2 in current reference 201 instances are connected by BEOL interconnect to have three "fins" active, and six "fins" connected by BEOL interconnect to be inactive. Connected this way, 201A, 201B, and 201C in FIG. 7 each carry ⅓ of current from reference current 301. ⅓ of the "fins" and ⅓ of the current of reference current 301 will create a voltage reference on PFEF 230 and NREF 231 from each of the three current references 201 that will cause nine "fins" in a charge pump 102 slice to mirror reference current 301. All nine "fins" of P1, P2, N1, and N2 FETs in charge pump 102 slices 102A, 102B, 102C, and 102D are enabled using BEOL interconnect. Therefore, each charge pump 102 slice carries a current equal to that of reference current 301 when enables 470 are active, as described above.

The foregoing example having nine "fins" in each of P1, P2, N1, and N2 has been used to explain how multiple instances of current reference 201 can be used to "average" mistracking using a layout shown in FIG. 7A and FIG. 7B. FIG. 7A shows four instances of charge pump 102 slice and three instances of current reference 201. Each instance of charge pump 102 is adjacent to a current reference 201. No two current references 201 are adjacent to each other as the object of multiple current references 201 is to get an "averaging" of FET mistracking. FIG. 7B show an exemplary block layout of the four instances of charge pump 102 slice and the three instances of current reference 201 butted together. In FIG. 7B, to protect current references 201A and 201C from FEOL shapes that aren't identical to those in charge pump 102 slices and current references 201, "shield" block 701A is placed adjacent to current reference 201A and "shield" block 701B is placed adjacent to current reference 701B. "Shield" blocks 701A and 701B have FEOL shapes identical to those in charge pump 102 slices and in current reference 201, but have all FETs connected with BEOL to be inactive.

An independent enable 470 may be coupled to each charge pump 102 slice. As shown in FIG. 7A, enable 470A is connected to charge pump 102A slice; enable 470B is connected to charge pump 102B slice; enable 470C is connected to charge pump 102C slice; and enable 470D is connected to charge pump 102D slice. If all enables 470 are "active" (a "1" in the exemplary buffer 490 in FIG. 4B), each charge pump 102 slice provides a current to FILT 124 and FILT 125 (with proper phases) equal to current reference 301 when INC 122 or DEC 123 is activated. FILT 124 and FILTN 125 each get four times the current of reference current 301 when INC 122 or DEC 123 is activated.

A "0" (in the embodiment of FIG. 4B) to a charge pump 102 slice stops that charge pump 102 slice and all "downstream" charge pump 102 slices from sending current from those charge pump slices 102 to FILT 124 and FILTN 125.

When more granularity is needed in current sent to FILT 124 and FILTN 125 when INC 122 or DEC 123 are active, additional charge pump 102 slices and current references 201 can be used, each charge pump 102 slice and each current reference 201 having more "fins" for P1, P2, N1, and N2. For example, 24 "fins" may be used for P1, P2, N1, and N2. Eight charge pump 102 slices may be used, each with a separate enable 470, so that current sent to FILT 124 and FILT 125 are 0 (all enables 470 "0"), ⅛ of reference current 301, ¼ of reference current 301, and so on.

Figure 8:
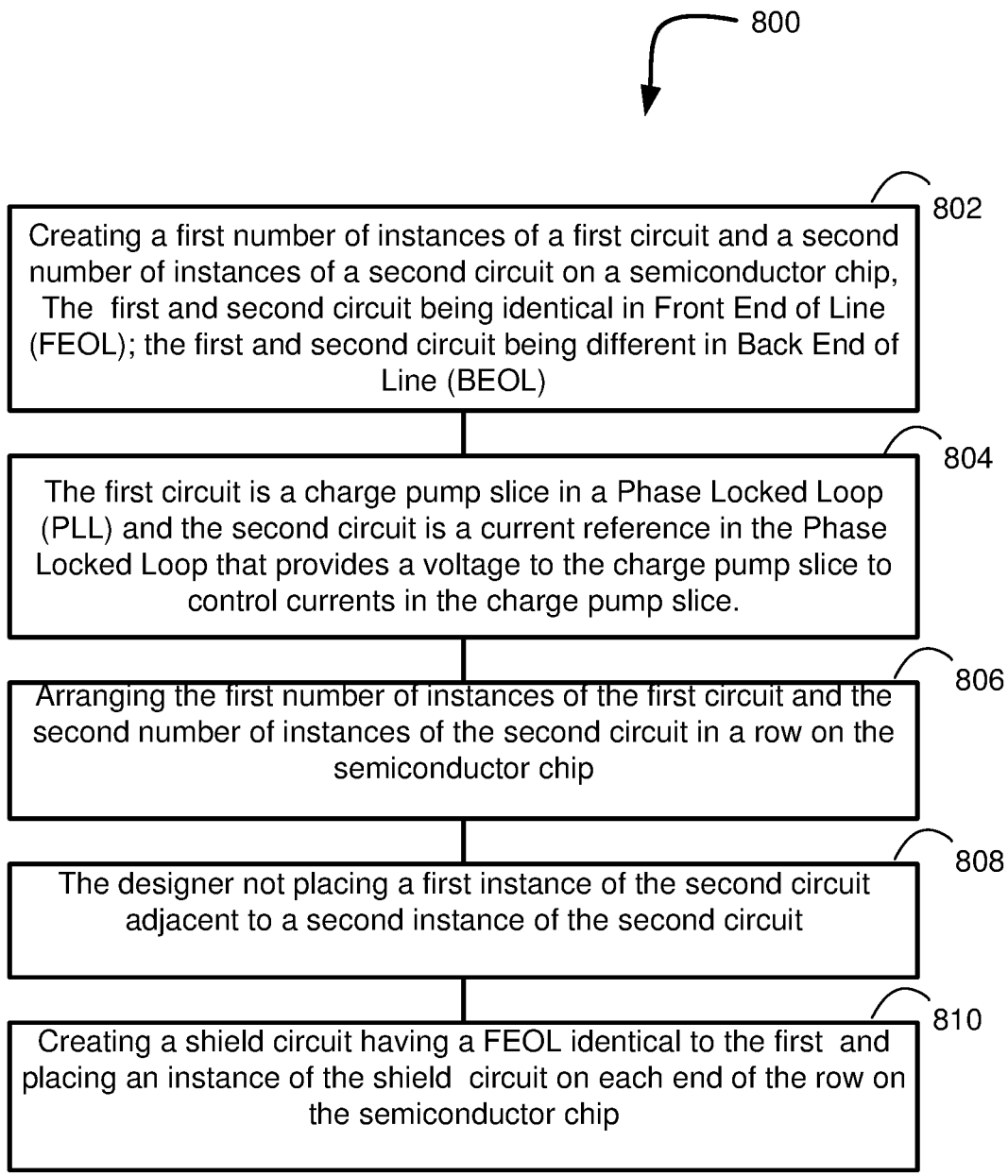
FIG. 8 is a flow chart showing a method to improve tracking between a first FET in a first circuit and a second FET in a second circuit, the first circuit being a charge pump slice and the second circuit being a reference circuit that provides a voltage used by the first circuit.

With reference now to FIG. 8, a method 800 is described to improve FET (Field Effect Transistor) tracking between two circuits on a semiconductor chip.

In block 802 the method teaches creating a first number of instances of a first circuit and a second number of instances of a second circuit on a semiconductor chip, The first and second circuit being designed by a designer to be identical in FEOL (Front End Of Line) shapes and layout; the first and second circuit being designed by the designer to be different in BEOL (Back End Of Line) shapes and layout.

In block 804, the designer uses BEOL shapes and layout for the first circuit to be a charge pump slice in a PLL (Phase Locked Loop) and different BEOL shapes and layout for the second circuit to be a current mirror voltage to be coupled with BEOL interconnect created by the designer to current mirroring FETs in the charge pump slice.

In block 806, arranging the first number of instances of the first circuit and the second number of instances of the second circuit in a row on the semiconductor chip.

In block 808, arranging the row such that a first instance of the second circuit is not adjacent to a second instance of the second circuit.

In block 810, further comprising creating a shield circuit having FEOL shapes and layouts to be identical to the FEOL in the first circuit and placing a first instance of the shield circuit at a first end of the row and a second instance of the shield circuit at a second end of the row.

What is claimed is:
1. A PLL (phase locked loop) comprising:
   a charge pump having one or more charge pump slices that receive a first current mirror voltage to control a mirroring PFET (P-channel Field Effect Transistor) current and a second current mirror voltage to control a mirroring NFET (N-channel Field Effect Transistor) current, the first and second current mirror voltages created by one or more current reference circuits;

each of the one or more current reference circuits creates the first and second current mirror voltages to be proportional to a reference current; and each of the one or more current reference circuits has FEOL (Front End Of Line) shapes and layout identical to FEOL shapes and layout in each of the one or more charge pump slices.

2. The PLL of claim 1, further comprising:

a PFD (phase frequency detector) to compare a reference signal having a reference signal frequency with a feedback signal frequency;

the charge pump coupled to an increment signal and a decrement signal from the PFD, the charge pump outputs a differential current signal based on receiving an active increment signal or an active decrement signal to a loop filter to provide a differential voltage to a VCO (Voltage Controlled Oscillator);

the VCO outputs a frequency dependent on the differential voltage; and a 1/N divider that divides the frequency of the frequency output by the VCO by "N", where "N" is the ratio of the VCO output frequency to the feedback reference signal frequency, the 1/N divider outputs the feedback signal frequency.

3. The PLL of claim 2, a magnitude of the differential current signal is dependent on a magnitude of the PFET current and the NFET current in the charge pump.

4. The PLL of claim 1, the charge pump having one or more charge pump slices arranged in a row, and one or more current reference circuits arranged in the row, none of the current reference circuits being adjacent to another current reference circuit.

5. The PLL of claim 4, further comprising a shield block on each end of the row, the shield block having FEOL shapes identical to the FEOL shapes in each of the one or more charge pump slices and in each of the one or more current reference circuits.

6. The PLL of claim 4, further comprising connecting, in the current reference circuits, using BEOL (Back End Of Line) interconnect, a number of PFETS from mirroring PFETS defined in the FEOL to mirror the first reference voltage, and connecting, using BEOL interconnect, the number of NFETs from mirroring NFETs defined in the FEOL the number being (1/number of current reference circuits).

* * * * *